United States Patent
Funaki et al.

[11] Patent Number: 5,981,983
[45] Date of Patent: Nov. 9, 1999

[54] HIGH VOLTAGE SEMICONDUCTOR DEVICE

[75] Inventors: Hideyuki Funaki, Tokyo; Yoshihiro Yamaguchi, Urawa, both of Japan

[73] Assignee: Kabushiki Kaisha Toshiba, Kawasaki, Japan

[21] Appl. No.: 08/933,135

[22] Filed: Sep. 18, 1997

[30] Foreign Application Priority Data

| Sep. 18, 1996 | [JP] | Japan | ................................... 8-246713 |
| Sep. 26, 1996 | [JP] | Japan | ................................... 8-254076 |

[51] Int. Cl.⁶ .................................................. H01L 29/68
[52] U.S. Cl. .......................... 257/138; 257/347; 257/341
[58] Field of Search ................................... 257/138, 347, 257/775, 341

[56] References Cited

U.S. PATENT DOCUMENTS

| 4,012,764 | 3/1977 | Satanaka | ................................. 257/775 |
| 5,321,285 | 6/1994 | Lee et al. | ................................ 257/296 |
| 5,567,976 | 10/1996 | Dierschke et al. | ....................... 257/466 |
| 5,629,546 | 5/1997 | Wu et al. | ................................ 257/368 |

FOREIGN PATENT DOCUMENTS

| 2-254754 | 10/1990 | Japan | ..................................... 257/775 |
| 0605854 | 1/1994 | Japan | ..................................... 257/382 |
| 6-69509 | 3/1994 | Japan . | |

*Primary Examiner*—Carl Whitehead, Jr.
*Attorney, Agent, or Firm*—Oblon, Spivak, McClelland, Maier & Neustadt, P.C.

[57] ABSTRACT

A semiconductor device includes a substrate, an insulating layer formed on the substrate, a base layer of a first conductivity type formed on the insulating layer, a drain layer of a second conductivity type selectively formed above the surface of the base layer of the first conductivity type, a drain electrode formed on and connected to the drain layer of the second conductivity type, a base layer of the second conductivity type selectively formed on the base layer of the first conductivity type, a source layer of the first conductivity type isolated from the base layer of the first conductivity type and selectively formed in the surface area of the base layer of the second conductivity type, a source electrode formed on and connected to the source layer of the first conductivity type and the base layer of the second conductivity type, and a gate electrode formed above a portion of the base layer of the second conductivity type which lies between the source layer of the first conductivity type and the base layer of the first conductivity type with a gate insulating film disposed therebetween.

9 Claims, 9 Drawing Sheets

HIGH VOLTAGE SEMICONDUCTOR DEVICE

BACKGROUND OF THE INVENTION

This invention relates to a high voltage semiconductor device and more particularly to a semiconductor device having an SOI (Silicon On Insulator) substrate.

In the field of power electronics, semiconductor power devices are widely and actively used in order to attain high controllability and energy saving. The types of the power devices used in this field are changed from the generation of current-controlled type power devices such as thyristors, GTOs (gate turn-off thyristors), and bipolar transistors to the generation of voltage-controlled type power devices using MOS gates, for example, power MOSFETs, and IGBTs (Insulated Gate Bipolar Transistors). The advent of the MOS power device has made the high-frequency switching possible, significantly enhanced the controllability of the device and reduced the size thereof.

As the structure of the IGBT, a four-layered structure of $p^+n^-pn^+$ obtained by additionally forming a $p^+$-type layer on the drain n ($n^-$) layer of an n-channel MOSFET is known. There are two types of structures, a vertical type structure in which the $p^+$-type collector (or the drain of the IGBT) layer is formed under the MOSFET and a lateral type structure in which it is formed in parallel to the MOSFET on the substrate on which the MOSFET is formed. In the case of lateral type, an SOI (Silicon On Insulator) substrate can be used and it is suitable for a smart power device having a control circuit and the like integrated therein.

In the operation of the n-channel IGBT, an inversion layer (channel) is formed in the p layer lying directly under the gate electrode by applying a positive voltage higher than the threshold voltage between the gate and emitter (or source of the IGBT) and then electrons are started to be injected from the $n^+$ layer lying directly under the emitter electrode into the $n^-$ drain (or base of the IGBT) layer. The electrons act as minority carriers in the $p^+n^-p$ transistor so as to cause holes to be introduced from the $p^+$ collector (drain) layer, thereby making it possible to perform the conductivity modulation and lower the saturation voltage between the collector and emitter.

Thus, the IGBT has two features including the feature of low ON-voltage of the bipolar transistor and the feature of the gate voltage control of the MOS device, and in the design of the IGBT for simultaneously attaining the above two features, it is important to set the trade-off between the low ON-voltage characteristic and the switching time into the optimum condition.

More specifically, in the IGBT, since the conductivity modulation is caused and the ON-resistance is lowered by injecting holes which are minority carriers into the $n^-$-type base layer, a current flows in the device while the stored holes are being discharged even if the gate is turned OFF to interrupt injection of the electrons, and as a result, the switching speed thereof becomes lower than that of the MOSFET. Various proposals have been made to enhance the switching speed.

BRIEF SUMMARY OF THE INVENTION

A first object of this invention is to provide a high voltage semiconductor device capable of attaining an excellent switching characteristic without lowering the withstand voltage or the like.

A second object of this invention is to provide a high voltage semiconductor device whose area can be reduced while keeping the excellent device characteristic.

In order to attain the above object, a semiconductor device according to a first aspect of this invention comprises a substrate; an insulating layer formed on the substrate; a base layer of a first conductivity type formed on the insulating layer; a drain layer of a second conductivity type selectively formed above the surface of the base layer of the first conductivity type; a drain electrode formed on and connected to the drain layer of the second conductivity type; a base layer of the second conductivity type selectively formed on the base layer of the first conductivity type; a source layer of the first conductivity type isolated from the base layer of the first conductivity type and selectively formed in the surface area of the base layer of the second conductivity type; a source electrode formed on and connected to the source layer of the first conductivity type and the base layer of the second conductivity type; and a gate electrode formed above a portion of the base layer of the second conductivity type which lies between the source layer of the first conductivity type and the base layer of the first conductivity type with a gate insulating film disposed therebetween.

A semiconductor device according to a second aspect of this invention comprises a substrate; an insulating layer formed on the substrate; a base layer of a first conductivity type formed on the insulating layer; a drain layer of a second conductivity type selectively formed above the surface of the base layer of the first conductivity type; a drain electrode formed on and connected to the drain layer of the second conductivity type; a base layer of the second conductivity type selectively formed on the base layer of the first conductivity type; a source layer of the first conductivity type selectively formed on the surface of the base layer of the second conductivity type; a source electrode formed on and connected to the source layer of the first conductivity type and the base layer of the second conductivity type; and a gate electrode formed above a portion of the base layer of the second conductivity type which lies between the source layer of the first conductivity type and the base layer of the first conductivity type with a gate insulating film disposed therebetween.

In the first and second aspects, it is preferable that the drain layer of the second conductivity type is formed of polycrystalline semiconductor.

Alternatively, the drain layer of the second conductivity type may be formed of single crystal semiconductor.

It is preferable to further provide a contact layer of the second conductivity type disposed between the source electrode and the base layer of the second conductivity type and having impurity concentration higher than that of the base layer of the second conductivity type.

It is preferable to further provide a buffer layer of the first conductivity type disposed between the base layer of the first conductivity type and the drain layer of the second conductivity type and having impurity concentration higher than that of the base layer of the first conductivity type.

The buffer layer of the first conductivity type can be formed of polycrystalline semiconductor.

In the semiconductor device according to the first aspect of this invention, since the drain layer of the second conductivity type is formed above the base layer of the first conductivity type, a steep interface of the drain layer of the second conductivity type is formed so that the thickness of the base layer of the first conductivity type can be made relatively large. Therefore, an excellent switching characteristic can be realized by lowering the impurity concentration of the drain layer of the second conductivity type and controlling the hole injection efficiency without lowering the withstand voltage.

Further, as the semiconductor device according to the second aspect of this invention, a semiconductor device which has the above feature and is difficult to be latched up can be provided.

A semiconductor device according to a third aspect of this invention comprises a substrate; an element region formed on the substrate; first and second main electrodes separately formed in substantially parallel on the element region; and first and second lead-out portions respectively formed for the first and second main electrodes and arranged in opposition to each other with the element region disposed therebetween; wherein the relation of WDAL1>WDAL2, WSAL1>WSAL2 is satisfied when the widths of two portions of the first main electrode which lie at different distances from the first main electrode lead-out portion are set to WDAL1 and WDAL2, the widths of two portions of the second main electrode which lie at different distances from the second main electrode lead-out portion are set to WSAL1 and WSAL2, the portion of WDAL1 is closer to the first main electrode lead-out portion than the portion of WDAL2, and the portion of WSAL1 is closer to the second main electrode lead-out portion than the portion of WSAL2.

It is desirable to continuously reduce the widths of the first and second main electrodes and make them smaller in positions farther apart from the first and second main electrode lead-out portions, respectively.

It is desirable that the semiconductor device is a semiconductor device in which the element region is formed as a unit region and which includes a plurality of unit regions, and the first and second main electrodes are disposed with a preset separation distance on the plurality of element regions, formed in a comb form and combined in a complementary fashion.

Further, it is desirable to form the element region above the substrate with an insulating film disposed therebetween.

The element region may include a base layer of the first conductivity type formed on the insulating film; a drain layer of the second conductivity type formed in substantially the same shape as the first electrode and connected to the first electrode above the surface of the base layer of the first conductivity type; a base layer of the second conductivity type formed in substantially the same shape as the second electrode and connected to the second electrode on the base layer of the first conductivity type; a source layer of the first conductivity type selectively formed on the surface of the base layer of the second conductivity type and connected to the second electrode; and a gate electrode formed above a portion of the base layer of the second conductivity type which lies between the source layer of the first conductivity type and the base layer of the first conductivity type with a gate insulating film disposed therebetween.

It is preferable that the drain layer of the second conductivity type is formed of polycrystalline semiconductor.

Alternatively, the drain layer of the second conductivity type may be formed of single crystal semiconductor.

It is preferable to further provide a contact layer of the second conductivity type disposed between the source electrode and the base layer of the second conductivity type and having impurity concentration higher than that of the base layer of the second conductivity type.

According to the third aspect of this invention, in the shapes of the first and second main electrodes which are drain and source electrodes in the case of an IGBT, for example, when viewed from above the element surface, the width thereof is not constant in the element region unlike the conventional case, the width of the drain electrode is smaller in a portion at a farther distance from the drain electrode lead-out portion than in a portion nearer thereto, the width of the source electrode is smaller in a portion at a farther distance from the source electrode lead-out portion than in a portion nearer thereto, and the drain electrode and the source electrode are kept in substantially parallel like the conventional case so that the area of the element can be reduced without deteriorating the element characteristic.

When reducing the electrode width, if the electrode width is reduced substantially continuously, current concentration can be prevented. As a result, in the case of IGBT, a latch-up phenomenon caused by the current concentration can be prevented.

As the above shape, it is most preferable to form the first and second main electrodes with a preset separation distance on a plurality of element regions in comb form and combined in a complementary fashion from the viewpoint that the device can be easily formed and the current concentration can be most easily prevented.

Further, if the element formed in the element region is an element such as an IGBT which performs the bipolar operation, the volume of a high-resistance layer such as an n-type layer of high resistance below the p-type drain layer in the IGBT, for example, becomes small so that the storage amount of holes and electrons in this region is reduced, and as a result, the turn-OFF time becomes shorter in the case of a switching element such as an IGBT or bipolar transistor and the reverse recovery time becomes short in the case of a diode.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
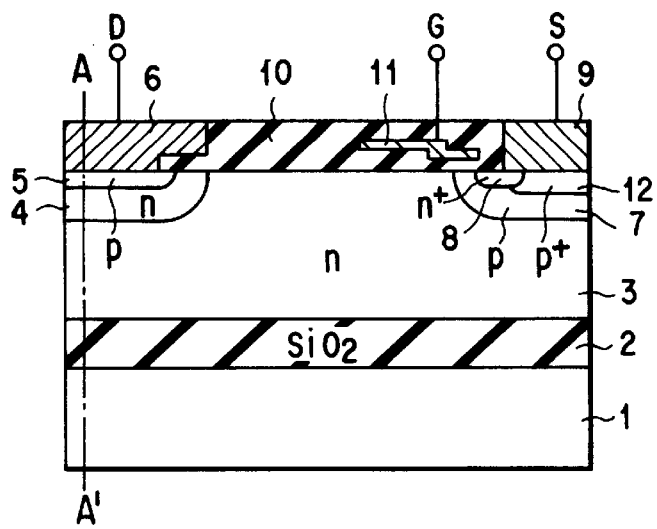
FIG. 1 is a cross sectional view schematically showing the structure of a conventional IGBT.

Before explaining the embodiments of this invention, the structure of a conventional lateral IGBT and the problem relating thereto are explained. FIG. 1 is a cross sectional view schematically showing the structure of this type of IGBT. The IGBT has a buried oxide film 2 and n-type base layer 3 sequentially formed on a silicon substrate 1. An n-type buffer layer 4 is selectively formed on the surface of the n-type base layer 3 without reaching the buried oxide film 2 and a p-type drain layer 5 is selectively formed as a p-type emitter layer on the surface of the n-type buffer layer 4. A drain electrode 6 is formed on the p-type drain layer 5.

Likewise, in the n-type base layer 3, a p-type base layer 7 is selectively formed from the surface thereof without reaching the buried oxide film 2. An n-type source layer 8 is selectively formed on the surface of the p-type base layer 7.

Further, a common source electrode 9 is selectively formed on part of the p-type base layer 3 and part of the n-type source layer 8. An insulating film 10 is formed on the layers lying between the source electrode 9 and the drain electrode 6. A gate electrode 11 is formed on a portion of the insulating film 10 which is formed in contact with the p-type base layer 7. Further, a p$^+$-type contact layer 12 of low resistance is formed under the central portion of the source electrode 9 so as to attain a desirable contact.

If a positive voltage is applied to the gate electrode 11, electrons of an amount corresponding to the positive voltage appear in the surface region of the p-type base layer 7 directly below the gate electrode and the surface region of the p-type base layer is inverted to an electron region. The inverted region acts as a channel to electrically connect the n-type source layer 8 to the n-type base layer 3.

At this time, if a positive voltage is applied to the drain electrode 6 and a negative voltage is applied to the source electrode 9, electrons are supplied from the source electrode 9 and injected from the n-type source layer 8 into the n-type base layer 3 via the channel. As a result, holes are injected from the p-type drain layer 5 into the n-type base layer 3 via the n-type buffer layer 4. Injection of the holes causes conductivity modulation in the n-type base layer 3 in which electrons and holes are present at high density and at substantially the same density to cancel the charges thereof each other so that the ON resistance of the base layer is lowered and it is set into a conductive state. Therefore, electrons in the n-type base layer 3 flow into the drain electrode 6 via the p-type drain layer 5, and holes in the n-type base layer 3 flow into the source electrode 9 via the p-type base layer 7.

However, in the IGBT described above, since the conductivity modulation is caused and the ON resistance is lowered by injecting holes which are minority carriers into the n-type base layer 3, a current flows in the element while the stored holes are being discharged even if the gate is turned OFF to interrupt injection of the electrons, and as a result, the switching speed thereof becomes lower than that of a MOSFET.

Figure 2:
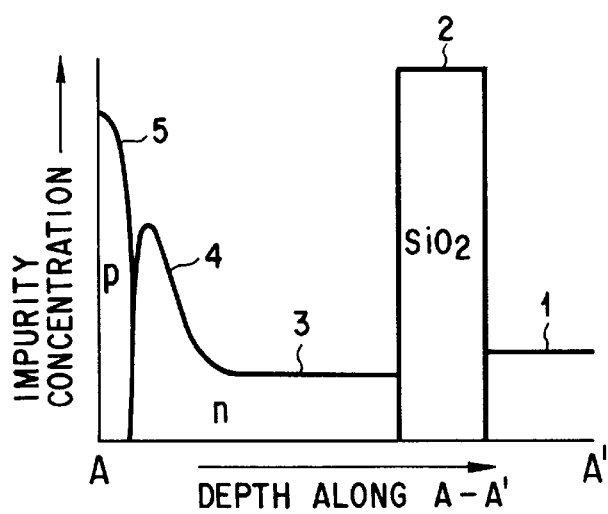
FIG. 2 is a diagram showing the impurity concentration distribution along the depth direction directly below a p-type drain layer of a conventional IGBT.

In order to improve the switching characteristic, it is necessary to lower the impurity concentration of the p-type drain layer 5 so as to lower the injection efficiency, and at the same time, it is necessary to form the p-type drain layer 5 which has a steep impurity concentration distribution in the depth direction. For example, FIG. 2 shows an impurity concentration distribution in the cross section taken along the line A–A' of FIG. 1. As is clearly seen from FIG. 2, in order to obtain the n-type buffer layer 4 of preset impurity concentration, it is necessary to make the layer thick if the impurity concentration distribution of the p-type drain layer 5 is smooth, but if the n-type buffer layer 4 is made thick, there occurs a problem that the n-type base layer 3 is made relatively thin to lower the current density and lower the withstand voltage of the device.

However, if a method for ion-implanting impurity and diffusing the same is used when the p-type drain layer 5 is formed, it becomes always necessary to make the surface impurity concentration of the p-type drain layer 5 significantly higher than the impurity concentration of the n-type buffer layer 4, thereby making it difficult to make the p-type drain layer 5 thin.

This invention has been made by taking the above problem into consideration to provide a semiconductor device capable of realizing an excellent switching characteristic without lowering the withstand voltage and the like.

There will now be described embodiments of this invention with reference to the accompanying drawings.

(First Embodiment)

Figure 3:
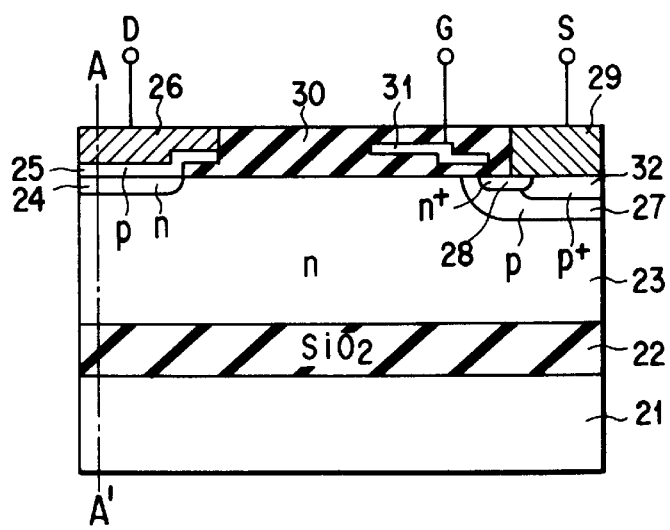
FIG. 3 is a cross sectional view schematically showing the structure of an IGBT according to a first embodiment of this invention.

FIG. 3 is a cross sectional view schematically showing the structure of an IGBT according to a first embodiment of this invention. The IGBT uses an SOI substrate and a buried oxide film 22 and an n-type base layer 23 are sequentially formed on a silicon substrate 21. An n-type buffer layer 24 is formed on the surface of the n-type base layer 23, and a p-type drain layer 25 acting as a p-type emitter layer is formed on the n-type buffer layer 24. A drain electrode 26 is formed on the p-type drain layer 25.

Further, a p-type base layer 27 is selectively formed on the surface of the n-type base layer 23, and an n$^+$-type source layer 28 is selectively formed on the surface of the p-type base layer 27. Further, a common source electrode 29 is selectively formed on part of the p-type base layer 27 and the n$^+$-type source layer 28.

An insulating film 30 is formed on the layers lying between the source electrode 29 and the drain electrode 26. A gate electrode 31 is formed on a portion of the insulating film 30 which is formed in contact with the p-type base electrode 27. Further, a p+-type contact layer 32 of low resistance is formed under the central portion of the source electrode 29 so as to attain a desirable contact.

In this case, the p-type drain layer 25 is formed as follows. After the n-type buffer layer 24 is formed by ion-implanting and diffusing phosphorus in a LOCOS (local oxidation of silicon) opening portion corresponding in position to the drain electrode 26, a gate insulating film is formed by gate oxidation. Then, after part of the gate insulating film is removed to expose the n-type buffer layer 24, polycrystalline silicon is deposited on the n-type buffer layer 24 by a CVD (chemical vapor deposition) method or the like, and boron is ion-implanted into the polysilicon layer and annealed to form the p-type drain layer 25. By deposition of polycrystalline silicon, the gate electrode 31 can be simultaneously formed. Alternatively, the gate electrode can be formed in a different step.

Next, the operation of the IGBT with the structure obtained as described above is explained.

Figure 4:
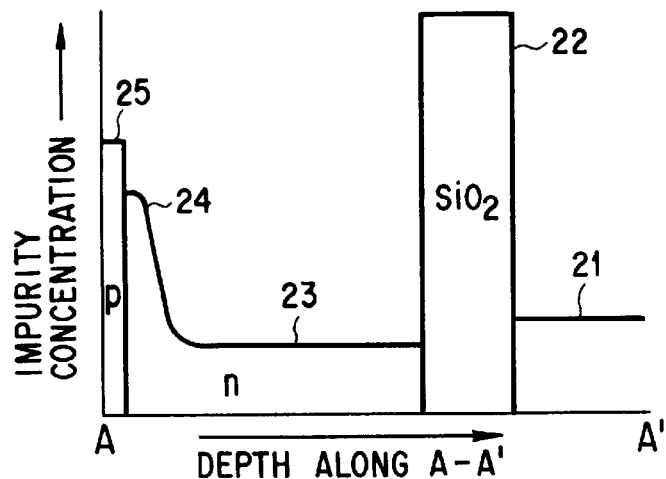
FIG. 4 is a diagram showing the impurity concentration distribution along the depth direction directly below a p-type drain layer of the IGBT of the first embodiment.

In the IGBT of this embodiment, since the p-type drain layer 25 is formed by deposition of polycrystalline silicon, the interface of the p-type drain layer 25 can be made steep as shown in FIG. 4 which shows an impurity concentration distribution in the cross section taken along the line A–A' of FIG. 3. As a result, the n-type buffer layer 24 can be made shallow, that is, the n-type base layer 23 can be made relatively thick so that the withstand voltage of the device can be enhanced and the current density can be increased.

Further, in the p-type drain layer 25, the impurity concentration can be lowered and the injection efficiency of carriers (holes) at the time of operation can be lowered by controlling the amount of implanted ion of boron after deposition of polycrystalline silicon. That is, the switching speed can be enhanced by reducing the injection amount of holes at the time of operation to reduce the stored amount of holes in the n-type base layer 23 and reduce the hole discharging time at the time of switching OFF.

Figure 5:
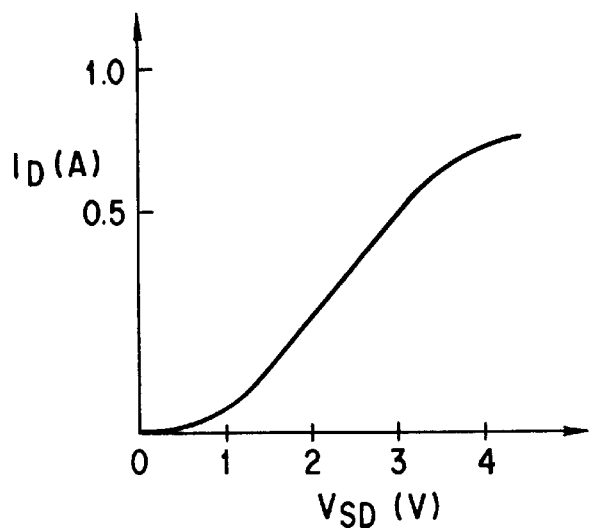
FIG. 5 is a diagram showing a current-voltage characteristic in the first embodiment.
Figure 6:
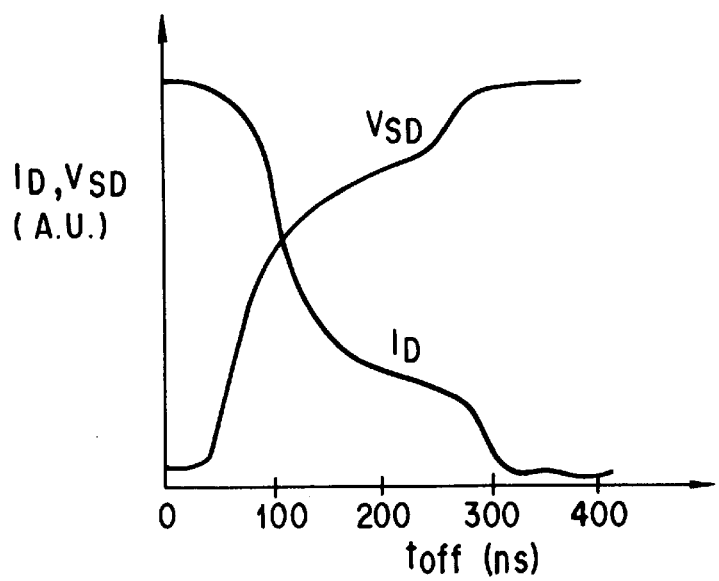
FIG. 6 is a diagram showing a turn-OFF characteristic in the first embodiment.

For example, when the dose of the n-type buffer layer 24 is set to $2 \times 10^{14}$ cm$^{-2}$ and the dose of the p-type drain layer 25 is set to $2 \times 10^{14}$ cm$^{-2}$, the current-voltage characteristic of the IGBT according to this embodiment shown in FIG. 5 and the turn-OFF characteristic shown in FIG. 6 are obtained. As shown in the drawing, a desirable result of the turn-OFF time toff of approximately 300 ns is obtained. In this case, the turn-OFF time of the IGBT with the conventional structure is approximately 1000 ns. In this embodiment, the ratio of the hole current to the whole current is suppressed to approximately 30%.

As described above, according to the first embodiment, since the p-type drain layer 25 is formed on the n-type buffer layer 24 and the steep interface of the p-type drain layer 25 and a lowering in the impurity concentration can be simultaneously attained, an excellent switching characteristic can be realized without lowering the withstand voltage or the like. The effect of this invention is explained in detail from the viewpoint of the trade-off between the switching characteristic and the ON voltage characteristic.

Figure 7:
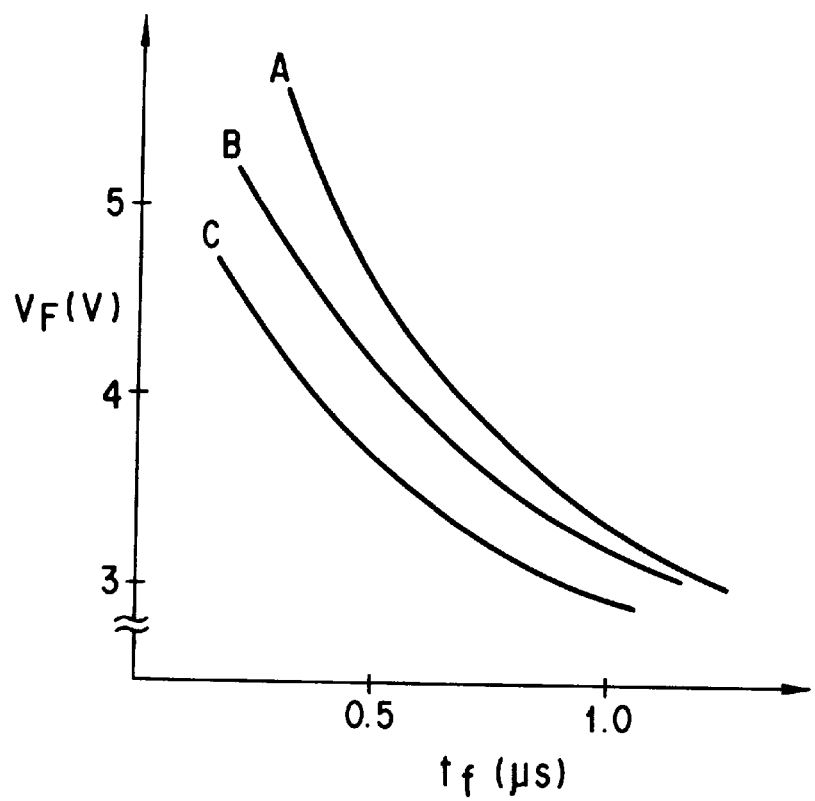
FIG. 7 is a diagram showing curves indicating the trade-off between the fall time and the ON voltage of lateral IGBTs.

FIG. 7 shows curves indicating the trade-off between the switching characteristic (fall time $t_f$) and the ON voltage ($V_F$) of lateral IGBTs. The curve A indicates a case of the conventional IGBT and the characteristic indicated by the curve is obtained by setting the dose of the n-type buffer layer to $1 \times 10^{13}$ to $10^{15}$ cm$^{-2}$. If an attempt is made to set the fall time equal to or less than 0.5 μs, the ON voltage $V_F$ rapidly increases. Therefore, the curve A can be changed to the curve B by lowering the dose of the p-type emitter layer from the conventional value of $5 \times 10^{15}$ cm$^{-2}$ to approximately $1 \times 10^{14}$ cm$^{-2}$ and the trade-off can be improved.

Since the polysilicon p-type emitter (dose of $1 \times 10^{14}$ cm$^{-2}$) is used in this invention, impurity which disappears by diffusion in the n-type buffer layer is not present, the fall time is reduced, and the impurity concentration profile of the pn junction becomes steep. Therefore, the injection efficiency of carriers from the p-type emitter layer with respect to the n-type buffer layer of the same dose is enhanced and the trade-off is further improved as a whole as indicated by the curve C.

In the first embodiment, impurity is ion-implanted into the polysilicon layer which is the p-type emitter layer, but it may be formed by depositing polycrystalline silicon previously doped with impurity (impurity concentration of $1 \times 10^{18}$ to $10^{19}$ cm$^{-2}$). When the above formation method is used, the same effect can be attained.

(Second Embodiment)

Next, an IGBT according to a second embodiment of this invention is explained.

Figure 8:
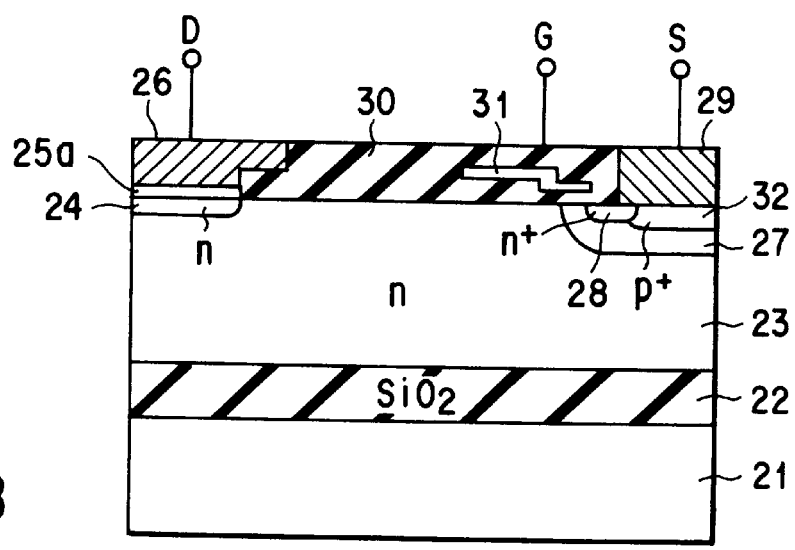
FIG. 8 is a cross sectional view schematically showing the structure of an IGBT according to a second embodiment of this invention.

FIG. 8 is a cross sectional view schematically showing the structure of the IGBT. Portions which are the same as those in FIG. 3 are denoted by the reference numerals and the explanation therefor is omitted.

The IGBT according to this embodiment is a modification of the first embodiment, and more specifically, a p-type drain layer 25a of single crystal formed by selective epitaxial growth is provided instead of the p-type drain layer 25 of FIG. 3 formed by deposition of polycrystalline silicon.

The p-type drain layer 25a has substantially the same impurity concentration distribution in the depth direction as in the case of FIG. 4 and can be formed by an MOCVD (metal organic chemical vapor deposition) method or MBE (molecular beam epitaxy) method, for example. Thus, the impurity concentration distribution in the depth direction of the IGBT according to this embodiment becomes substantially the same as that of FIG. 4 in the cross section taken along the A–A' line.

With the above structure, the IGBT according to this embodiment can attain the same effect as that of the first embodiment. Further, since the impurity concentration of the p-type drain layer 25a can be controlled with high precision by the epitaxial growth, the carrier injection efficiency can be more precisely controlled.

(Third Embodiment)

Next, an IGBT according to a third embodiment of this invention is explained.

Figure 9:
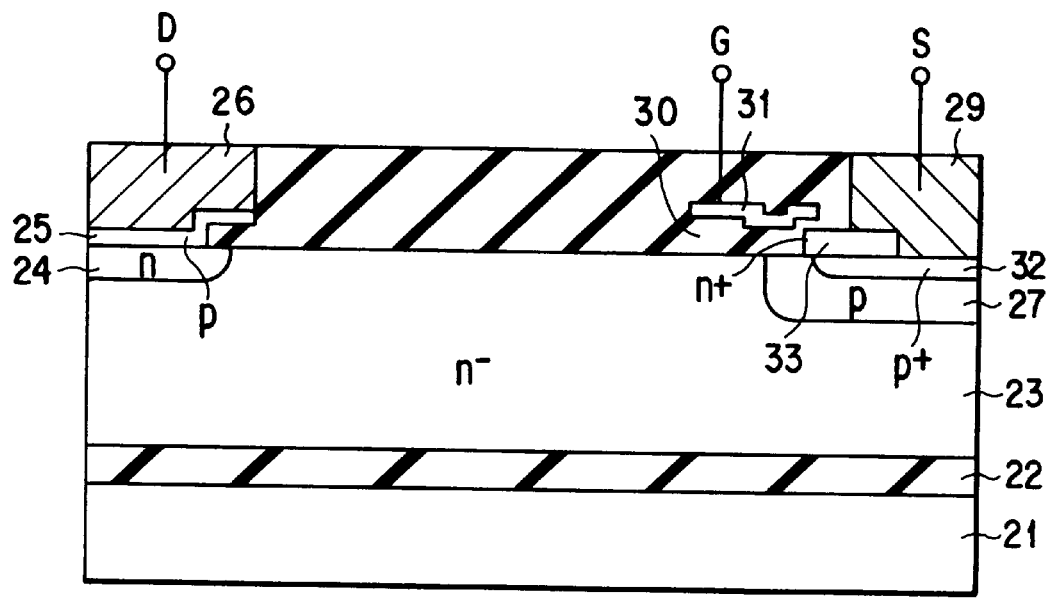
FIG. 9 is a cross sectional view schematically showing the structure of an IGBT according to a third embodiment of this invention.

FIG. 9 is a cross sectional view schematically showing the structure of the IGBT. Portions which are the same as those in FIG. 3 are denoted by the reference numerals and the explanation therefor is omitted.

The IGBT according to this embodiment is a modification of the first embodiment, and more specifically, as shown in FIG. 9, the n-type source layer 28 of FIG. 3 is omitted, a region of the p+-type contact layer 32 is formed to extend to a region in which the n-type source layer 28 has been formed, and an n+-type emitter layer 33 formed by deposition of polycrystalline silicon is formed on part of the p-type base layer 27 and part of the p+-type contact layer 32 and in contact with the source electrode 29.

With the above structure, the n+-type emitter layer 33 can effect the same electron injecting operation as the n+-type emitter layer 28 of FIG. 3. Further, since the p+-type contact layer 32 is formed to extend to a portion near the n−-type base layer 23 in the surface portion of the p-type base layer 27, a voltage drop by hole current flowing through the p-type base layer 27 can be suppressed and the resistance to the latch-up phenomenon can be enhanced.

The p-type drain layer 25 may be formed of polycrystalline semiconductor as in the case of the first embodiment or may be formed of single crystal semiconductor as in the case of the second embodiment. Further, the n-type buffer layer 24 may be formed of polycrystalline semiconductor as will be described in a fourth embodiment.

(Fourth Embodiment)

Next, an IGBT according to a fourth embodiment of this invention is explained.

Figure 10:
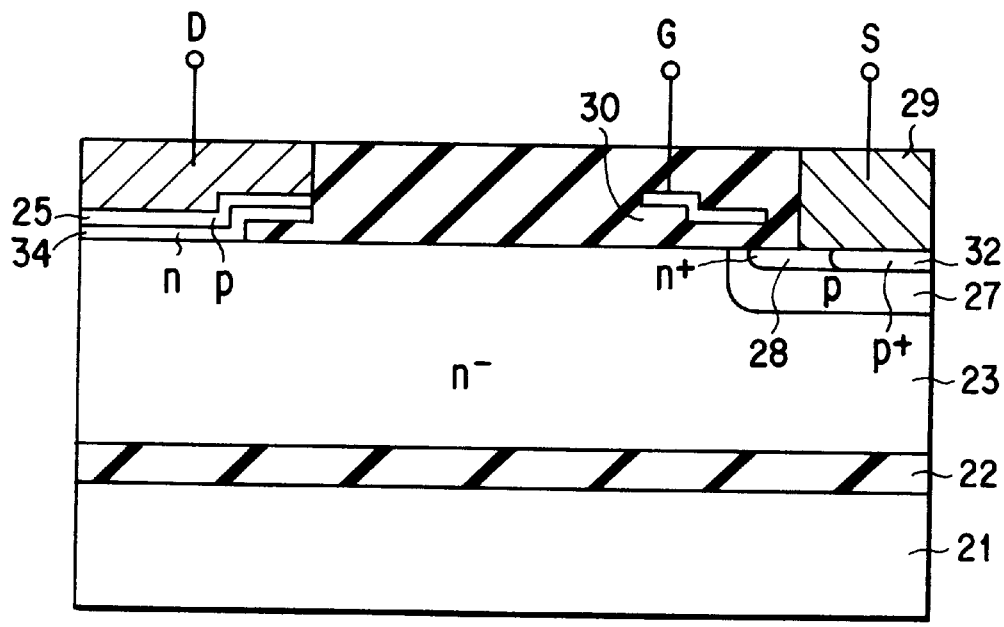
FIG. 10 is a cross sectional view schematically showing the structure of an IGBT according to a fourth embodiment of this invention.

FIG. 10 is a cross sectional view schematically showing the structure of the IGBT. Portions which are the same as those in FIG. 3 are denoted by the reference numerals and the explanation therefor is omitted.

The IGBT according to this embodiment is a modification of the first embodiment, and more specifically, the n-type buffer layer 24 of FIG. 3 is omitted, and an n-type buffer layer 34 formed by deposition of polycrystalline silicon is formed between the n−-type base layer 23 and the p-type drain layer 25.

With the above structure, the IGBT of this embodiment has the same effect as that in the first embodiment, and since it is not necessary to reduce the thickness of the n−type base layer 23, the withstand voltage can be enhanced.

Further, in the IGBT, since the n-type buffer layer 34 is formed of polycrystalline silicon, the carrier life time is shortened and the switching speed can be further enhanced.

In each of the above embodiments, a case wherein the first conductivity type is set to an n type and the second conductivity type is set to a p type is explained, but this invention is not limited to the above embodiments and the conductivity types can be inverted.

Next, a problem relating to the element size of a lateral IGBT according to a third aspect of this invention is explained.

Figure 11:
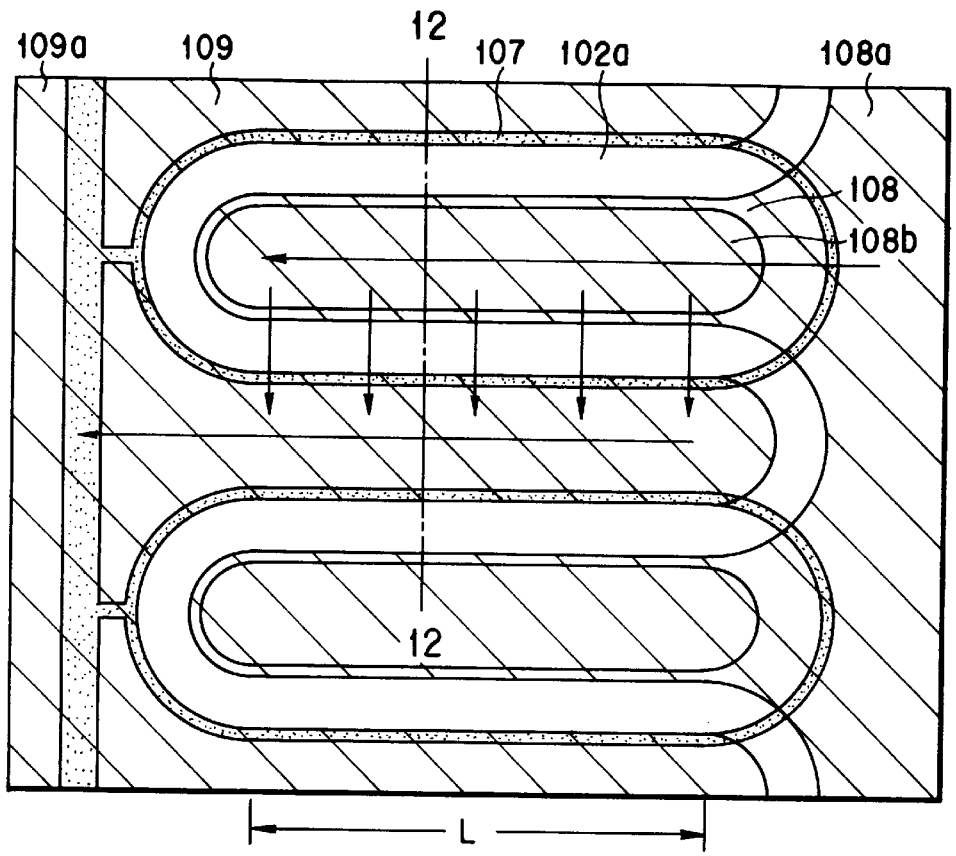
FIG. 11 is a plan view showing a conventional lateral IGBT.
Figure 12:
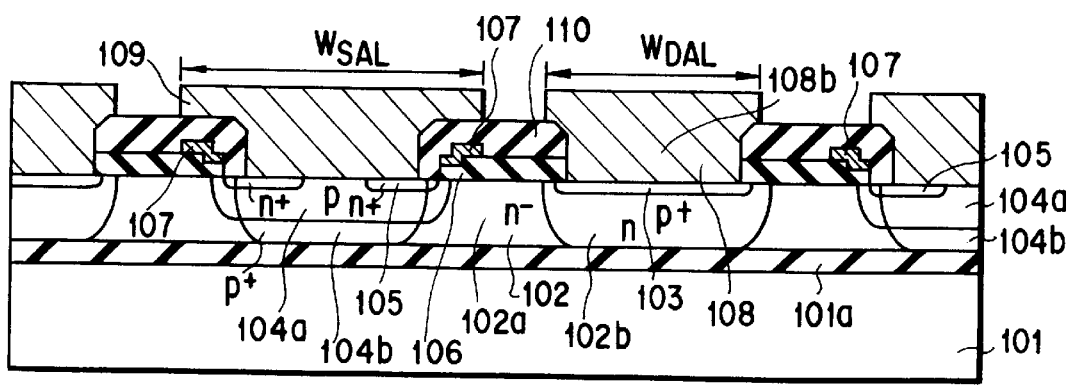
FIG. 12 is a cross sectional view taken along the line 12—12 of FIG. 11.

FIG. 11 is a plan view showing a conventional lateral IGBT using an SOI substrate and FIG. 12 is a cross sectional view taken along the line 12—12 of FIG. 11.

In FIGS. 11 and 12, a reference numeral 101 denotes a p-type or n-type silicon substrate and an n-type layer 102 of high resistance is formed above the substrate 101 with an insulating film 101a disposed therebetween. Buffer layers 102b of n type of impurity concentration higher than that of the n-type layer 102 are selectively formed in the n-type layer 102 and a p-type drain layer 103 of high impurity concentration is formed on the surface of the n-type buffer layer 102b. Base layers 104a, 104b of p type are formed to surround the p-type drain layer 103 with a preset separation distance from the p-type drain layer 103. Further, n-type source layers 105 of high impurity concentration are selectively formed on the surface of the p-type base layer 104 and a gate electrode 107 is formed above the surface of a portion of the p-type base layer 104 (logical sum of 104a and 104b) which lies between the n-type source layer 105 and the n-type layer 102 with a gate insulating film 106 disposed therebetween. A drain electrode 108 which is formed in ohmic contact with the p-type drain layer 103 and a source electrode which is formed in ohmic contact with both of the n-type source layer 105 and the p-type base layer 104 are provided.

A reference numeral 108a in FIG. 11 denotes a drain electrode lead-out portion, and 109a denotes a source electrode lead-out portion. A contact portion 108b of the drain electrode 108 which is formed in contact with the p-type drain layer 103 is surrounded by an exposed portion 102a of the n-type layer 102 which is exposed to the wafer surface and the gate electrode 107 as shown in FIG. 11 and one IGBT cell is thus defined.

The hole current in the conventional lateral IGBT constructed as shown in FIGS. 11 and 12 flows from the drain electrode lead-out portion 108a, passes through the drain electrode 108 of each IGBT cell and the source electrode 109, and then flows into the source electrode lead-out portion 109a as indicated by arrows in FIG. 11.

In a case where the length L in the lengthwise direction of each IGBT cell is set to 1 mm, for example, a current of 200 mA flows in one IGBT cell in the case of lateral IGBT having a withstand voltage of 600V. If an Al layer with a thickness of 2 μm is used for the drain electrode 108 and source electrode 109, it becomes necessary to set the width WDA1 of the drain electrode 108 and the width WSA1 of the source electrode 109 shown in FIG. 12 to 70 μm or more by taking the reliability into consideration and the area of the device becomes large depending on the electrode widths.

The electrode width may be reduced in order to reduce the area of the device, but if the electrode width is reduced, the current density becomes high, thereby degrading the reliability of the Al electrode. The reliability of the Al electrode can be maintained if the Al electrode is made thick, but in this case, it becomes difficult to reduce the size of the device and there occurs a new problem that breakage of a passivation film at a stepped portion may occur on the surface of the device. In either case, it is difficult to reduce the size of the device while maintaining the desirable device characteristic.

A second aspect of this invention is made in order to solve the above problem and an object thereof is to provide a high voltage semiconductor device whose area can be reduced while a desirable device characteristic is maintained.

Next, an embodiment of the second aspect of this invention is explained.

(Fifth Embodiment)

Figure 13:
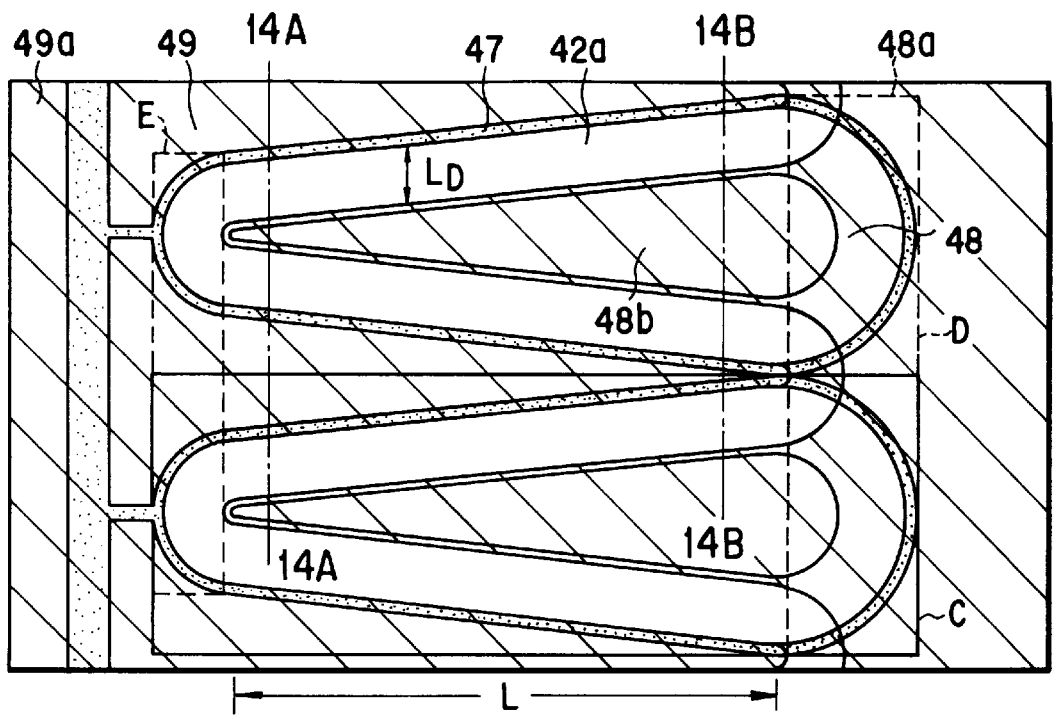
FIG. 13 is a plan view showing a lateral IGBT according to a fifth embodiment of this invention.
Figure 14A:
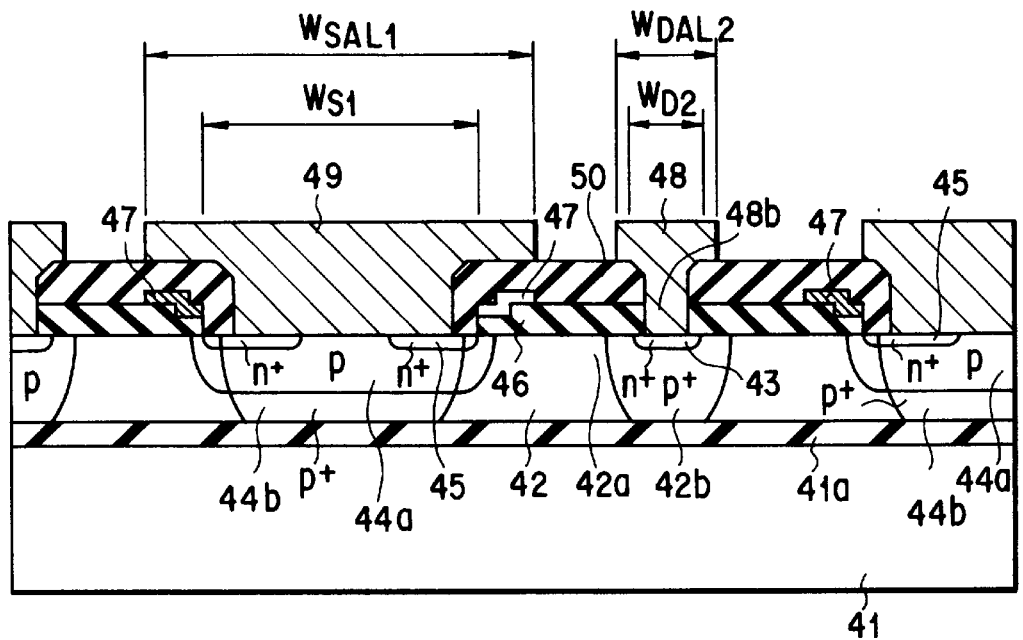
FIGS. 14A and 14B are cross sectional views taken along the lines 14A—13A and 14B—14B, respectively.
Figure 14B:
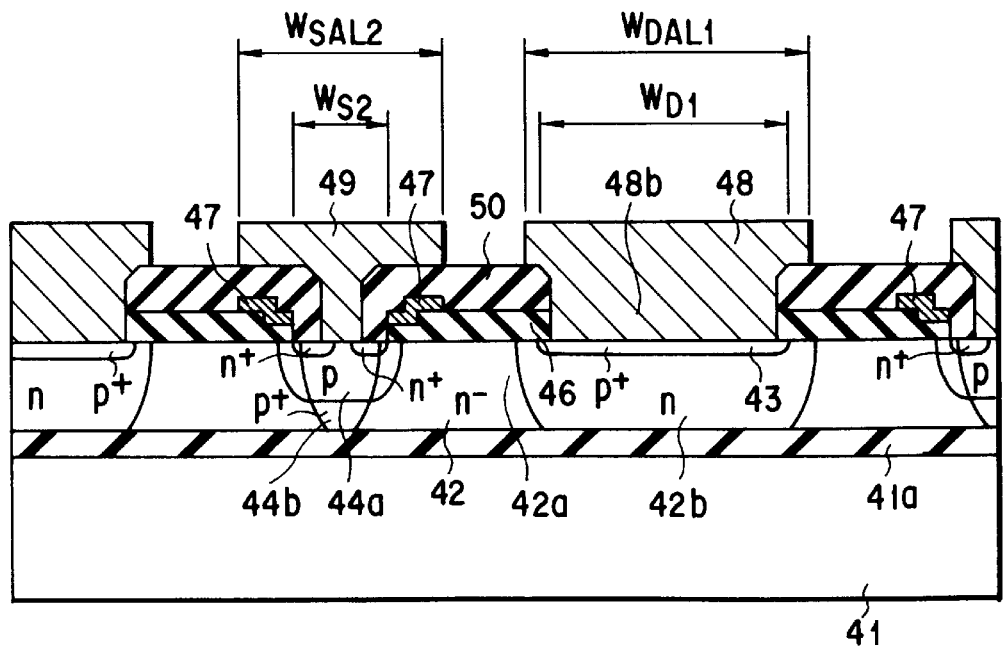

FIG. 13 is a plan view showing a lateral IGBT according to a fifth embodiment of this invention, and FIGS. 14A and 14B are cross sectional views taken along the lines 14A—14A and 14B—14B of FIG. 13, respectively.

In FIGS. 13, 14A and 14B, a reference numeral 41 denotes a p-type or n-type silicon substrate, an insulating film 41a formed of a silicon oxide film with a thickness of approximately 1 to 3 μm is disposed on the substrate 41 and an n-type layer 42 of high resistance with a thickness of approximately 5 to 15 μm is formed on the insulating film 41a. An SOI substrate is formed of the substrate 41, insulating film 41a and n-type layer 42.

Buffer layers 42b of n type of impurity concentration higher than that of the n-type layer 42 and with a thickness of approximately 5 to 15 μm are selectively formed in the n-type layer 42 and a p-type drain layer 43 of high impurity concentration with a thickness of approximately 0.2 to 2 μm is formed on the surface of the n-type buffer layer 42b. A p-type base layer 44a with a thickness of approximately 2 to 4 μm and a p-type base layer 44b with a thickness of approximately 5 to 15 μm are formed to surround the p-type drain layer 43 with a preset separation distance from the p-type drain layer 43. A portion disposed between the p-type drain layer 43 and the p-type base layer 44b is a portion 42a of the n-type layer exposed to the wafer surface.

Further, n-type source layers 45 of high impurity concentration with a thickness of approximately 0.1 to 0.3 μm are selectively formed on the surface of the p-type base layer 44 (logical sum of 44a and 44b), a gate insulating film 46 formed of a silicon oxide film with a thickness of approximately 0.02 to 0.06 μm is disposed on the surface of a portion of the p-type base layer 44 which lies between the n-type source layer 45 and the n-type layer 42 and a gate electrode 47 is formed on the gate insulating film 46. A portion of the gate insulating film 46 which is made thick acts as a field oxide film and the thickness thereof is approximately 0.5 to 1.5 μm.

A drain electrode 48 formed of Al with a thickness of approximately 2 μm and used as a first main electrode which is formed in ohmic contact with the p-type drain layer 43 and a source electrode 49 formed of Al with a thickness of approximately 2 μm and used as a second main electrode which is formed in ohmic contact with both of the n-type source layer 45 and the p-type base layer 44 are provided.

A reference numeral 48a in FIG. 13 denotes a drain electrode lead-out portion, and 49a denotes a source electrode lead-out portion. A contact portion 84b of the drain electrode 48 which is formed in contact with the p-type drain layer 43 is surrounded by an exposed portion 42a of the n-type layer 42 and the gate electrode 47 as shown in FIG. 13 and thus one IGBT cell surrounded by a solid line C in FIG. 13 is defined. A portion surrounded by broken lines D and E is a region in which the gate electrode 47 is formed but which does not function as an element.

The feature of this embodiment is that the width of the drain electrode 48 is substantially continuously reduced in a direction from the drain electrode lead-out portion 48a towards the source electrode lead-out portion 49a and the drain electrode is wedge-shaped, and the width of the source electrode 49 is substantially continuously reduced in a reverse direction from the source electrode lead-out portion 49a towards the drain electrode lead-out portion 48a and the drain electrode is wedge-shaped. Further, in the element region, the drain electrode 48 and the source electrode 49 are disposed in parallel to each other, that is, the width of the exposed portion 42a of the n-type layer 42 is constant, and it is possible to say that the drain electrode 48 and the source electrode 49 are formed in a comb form and combined in a complementary fashion with the exposed portion 42a disposed therebetween. This configuration corresponds to the shapes of the p-type drain layer 43 and the p-type base layer 44 in which the n-type source layer 45 is formed.

As shown in FIG. 14A, the width of the source electrode 49 on the cross section taken along the line 14A—14A is defined as WSAL1, a distance between the outermost ends of the two n-type source layers 45 formed in the p-type base layer 44 is defined as WS1, the width of the drain electrode is defined as WDAL2, and the width of the drain layer 43 is defined as WD2. Further, as shown in FIG. 14B, the width of the source electrode 49 on the cross section taken along the line 14B—14B is defined as WSAL2, a distance between the outermost ends of the two n-type source layers 45 formed in the p-type base layer 44 is defined as WS2, the width of the drain electrode is defined as WDAL1, and the width of the drain layer 43 is defined as WD1. In this case, the following relations are satisfied.

$$WDAL1 > WDAL2 \quad (1)$$

$$WD1 > WD2 \quad (2)$$

$$WSAL1 > WSAL2 \quad (3)$$

$$WS1 > WS2 \quad (4)$$

Generally, if the width of the p-type drain layer 43 or the width of the p-type base layer 44 in which the n-type source layer 45 is formed is determined, the widths of the drain electrode 48 and the source electrode 49 are determined to be larger than the widths of the p-type drain layer 43 and the p-type base layer 44. Further, since the area of the element is limited by the widths of the drain electrode 48 and the source electrode 49, the above expressions (1) to (4) can be represented by the expressions (1) and (3).

For example, in a case where the length of the straight portion of the electrode in the lengthwise direction of the IGBT cell of FIG. 13 is L and if L=1 mm, WDAL1=70 μm, WDAL2=6 μm, WSAL1=70 μm and WSAL2=6 μm, then the area of the IGBT cell (the area of a portion surrounded by the solid line C in FIG. 13) is reduced by more than 30% in comparison with the conventional lateral IGBT shown in FIGS. 11 and 12, for example.

The relation between the decreasing ratio of the area of the element and the expressions (1) to (4) is explained with reference to FIGS. 15 and 16.

Figure 15:
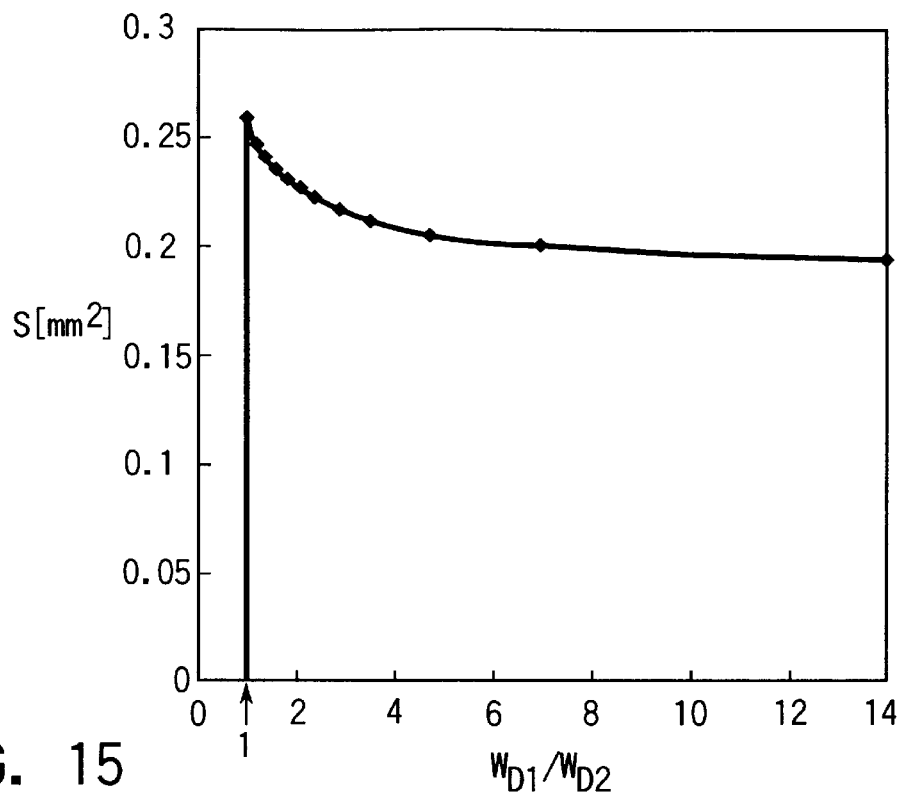
FIG. 15 is a diagram showing the relation between the cell area and the electrode width of the lateral IGBT according to the fifth embodiment of this invention.

FIG. 15 is a diagram showing the relation between the amount of variation in WD1/WD2 and the amount of variation in the area S [mm$^2$] of one IGBT cell C when L=1 mm, WD1=70 μm, the width LD of the exposed portion 2a=60 μm in the lateral IGBT of FIGS. 13, 14A and 14B and the above values are fixed. In FIG. 15, the abscissa indicates WD1/WD2 and the ordinate indicates S [mm$^2$]. S can be derived by S=(WD1+WD2+0.12)×L. As is clearly seen from FIG. 15, if WD1/WD2 exceeds 7, S becomes substantially constant.

Figure 16:
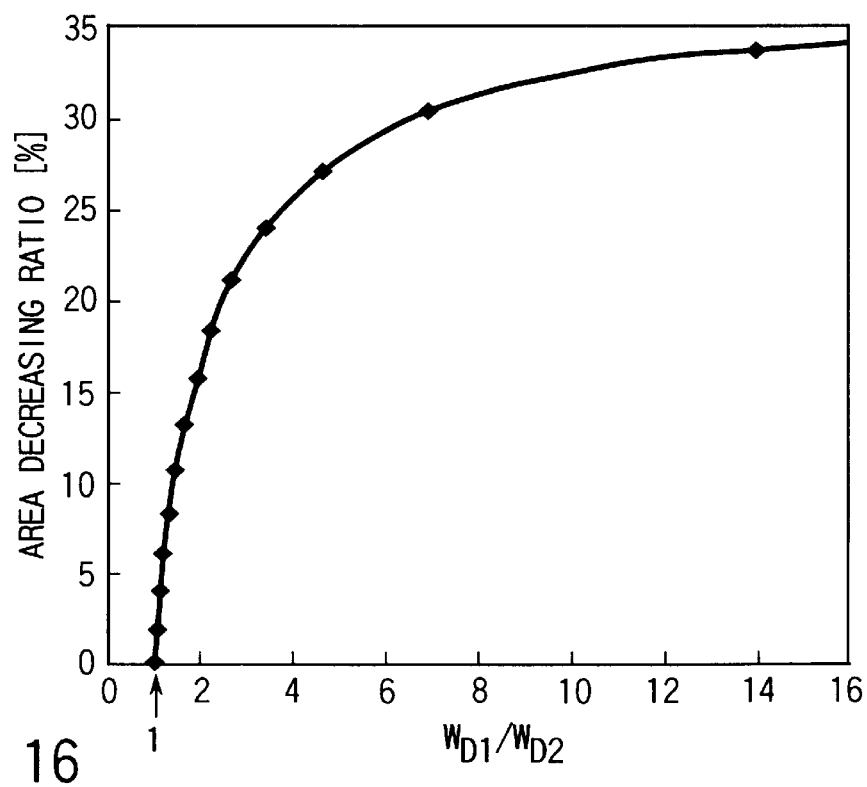
FIG. 16 is a diagram showing the relation between the cell area decreasing ratio and the electrode width of the lateral IGBT according to the fifth embodiment of this invention.

The relation obtained by using the area decreasing ratio [%] instead of S for the ordinate in order to make it clearer is shown in FIG. 16. As is clearly seen from FIG. 16, when WD1/WD2 exceeds 7, the area decreasing ratio exceeds 30% and a sufficiently large area reduction effect can be attained, and therefore, it is preferable to set WD1/WD2≧7.

Thus, the area reduction effect can be attained by use of the electrode shape of this embodiment, but the effect attained by the electrode shape is not limited to the above effect. The other effects are explained below.

First, like the case of the conventional IGBT, a hole current flows from the drain electrode lead-out portion 48a, passes through the drain electrode 48 of each IGBT cell C and each of the source electrodes 49 and flows into the source electrode lead-out portion 49a. At this time, since the hole current becomes smaller in a portion farther apart from the drain electrode lead-out portion 48a, the current density will not increase even if the width of the drain electrode 48 is reduced, and therefore, the reliability of the Al electrode will not be lowered.

An electron current increases in a portion nearer to the source electrode lead-out portion 49a, but since the width of the source electrode 49 is made larger in a portion nearer to the source electrode lead-out portion 49a, the current density will not increase like the case of the hole current, and therefore, the reliability of the Al electrode will not be lowered.

Since the reliability is not lowered even if the thickness of the Al electrode is set equivalent to that of the conventional case and the element area can be reduced, the effect that the element area can be reduced while maintaining the excellent element characteristic can be attained according to this embodiment.

Further, since the volume of the n-type layer 42 under the p-type drain layer 43 becomes small in a portion in which the width of the drain electrode 48 or the width of the p-type drain layer 43 is small, the storage amounts of holes injected from the p-type drain layer 43 and electrons injected from the n-type source layer 45 in this portion are reduced. As a result, the turn-OFF time is shortened.

In the same condition of L=1 mm, since the channel width can be made larger in comparison with the case of the conventional lateral IGBT as shown in FIGS. 11 and 12, the channel resistance is reduced, and accordingly, the ON resistance is reduced.

Figure 17:
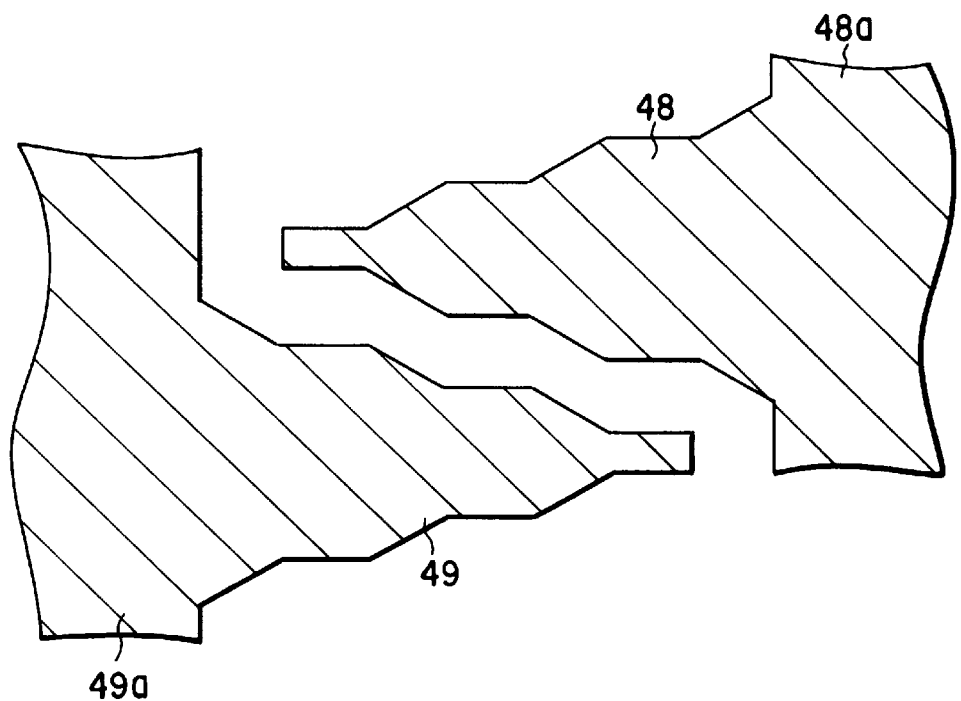
FIG. 17 is a view showing the shape of the electrode in a modification of the fifth embodiment.

In this invention, it is possible to use an electrode shape other than that shown in FIG. 13 without departing from the technical scope thereof. One example of the electrode shape is shown in FIG. 17. In FIG. 17, for clarifying the explanation, only the drain electrode 48 and source electrode 49 are shown.

As shown in FIG. 17, the drain electrode 48 and source electrode 49 are formed in a substantially continuously smoothly-stepped form. When a p-type drain layer lying under the drain electrode 48 and a p-type base layer lying under the source electrode 49 are formed in the same configuration as the respective electrodes, it is desirable that an n$^+$-type source layer is not formed in a sharp corner portion of the p-type base layer (under the source electrode 49) in order to prevent occurrence of the latch-up phenomenon caused by concentration of the hole current flowing in the p-type base layer under the n-type source layer.

Figure 18A:
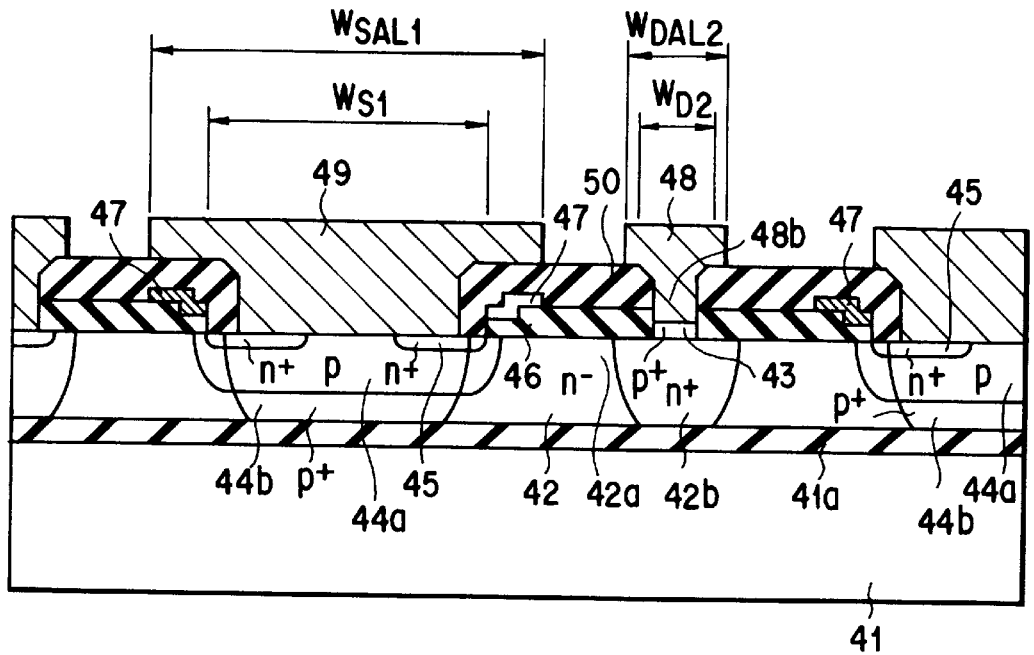
FIGS. 18A and 18B are cross sectional views showing an example of a combination of the structure of the fifth embodiment and the structure of the first or second embodiment and respectively corresponding to FIGS. 14A and 14B.
Figure 18B:
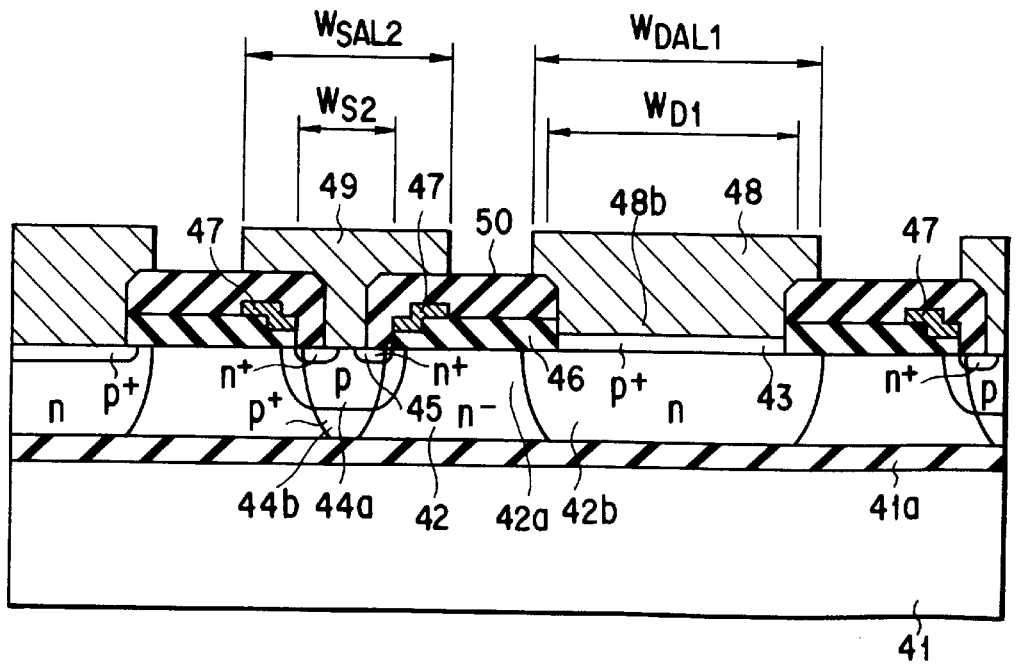

Further, as shown in FIGS. 18A and 18B, the drain layer 43 may be formed of polycrystalline semiconductor on the n-type buffer layer 42b as in the case of the first embodiment. With this structure, an IGBT of small size with excellent switching characteristic can be attained.

This invention is not limited to the fifth embodiment. For example, instead of the n-type layer 42, a p-type layer can be used and a bulk substrate or epitaxial substrate can be used instead of the SOI substrate. Further, all of the conductivity types used in the above embodiments can be inverted. This invention can be applied to a MOSFET by replacing the p-type drain layer of the IGBT by an n-type drain layer or can be applied to a bipolar transistor or diode. When this invention is applied to a MOSFET, since the channel width thereof is increased, the ON resistance is reduced as in the case of IGBT. Further, since a bipolar transistor or diode is an element basically performing the bipolar operation, the turn-OFF time is reduced in the case of bipolar transistor and the reverse recovery time is reduced in the case of diode.

As described above, according to this invention, a high voltage semiconductor device in which the element area can be reduced while maintaining the excellent element characteristic can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. An insulated gate bipolar transistor comprising:
   a base layer of a first conductivity type;
   a drain layer of a second conductivity type selectively formed above the surface of said base layer of the first conductivity type;
   a drain electrode formed on and connected to said drain layer of the second conductivity type;
   a base layer of the second conductivity type selectively formed on said base layer of the first conductivity type;
   a source layer of the first conductivity type isolated from said base layer of the first conductivity type and selectively formed in the surface area of said base layer of the second conductivity type;
   a source electrode formed on and connected to said source layer of the first conductivity type and said base layer of the second conductivity type;
   a gate electrode formed above a portion of said base layer of the second conductivity type which lies between said source layer of the first conductivity type and said base layer of the first conductivity type with a gate insulating film disposed therebetween; and
   a buffer layer of the first conductivity type having an impurity concentration higher than that of said base layer of the first conductivity type and disposed between said base layer of the first conductivity type and said drain layer of the second conductivity type;
   wherein said buffer layer of the first conductivity type is formed of polycrystalline semiconductor.

2. An insulated gate bipolar transistor according to claim 1, wherein said drain layer of a second conductivity type is formed of polycrystalline semiconductor.

3. An insulated gate bipolar transistor according to claim 1, further comprising a contact layer of the second conductivity type having impurity concentration higher than that of said base layer of the second conductivity type and disposed between said source electrode and said base layer of the second conductivity type.

4. An insulated gate bipolar transistor comprising:
   a base layer of a first conductivity type;
   a drain layer of a second conductivity type selectively formed above the surface of said base layer of the first conductivity type;
   a drain electrode formed on and connected to said drain layer of the second conductivity type;
   a base layer of the second conductivity type selectively formed on said base layer of the first conductivity type;
   a source layer of the first conductivity type selectively formed on the surface of said base layer of the second conductivity type;
   a source electrode formed on and connected to said source layer of the first conductivity type and said base layer of the second conductivity type;
   a gate electrode formed above a portion of said base layer of the second conductivity type which lies between said source layer of the first conductivity type and said base layer of the first conductivity type with a gate insulating film disposed therebetween; and
   a buffer layer of the first conductivity type having an impurity concentration higher than that of said base layer of the first conductivity type and disposed between said base layer of the first conductivity type and said drain layer of the second conductivity type;
   wherein said buffer layer of the first conductivity type is formed of polycrystalline semiconductor.

5. An insulated gate bipolar transistor according to claim 4, wherein said drain layer of a second conductivity type is formed of polycrystalline semiconductor.

6. An insulated gate bipolar transistor according to claim 4, further comprising a contact layer of the second conductivity type having impurity concentration higher than that of said base layer of the second conductivity type and disposed between said source electrode and said base layer of the second conductivity type.

7. A semiconductor device comprising:

a substrate;

an element region formed above said substrate with an insulating film disposed therebetween;

first and second main electrodes separately formed substantially in parallel on said element region; and first and second lead-out portions respectively formed for said first and second main electrodes and arranged in opposition to each other with said element region disposed therebetween, wherein the widths of said first and second main electrodes are continuously reduced and are smaller in positions farther apart from said first and second main electrode lead-out portions, respectively, and wherein said element region includes:

a base layer of the first conductivity type formed on said insulating film;

a drain layer of the second conductivity type formed of polycrystalline semiconductor and formed in substantially the same shape as said first electrode and connected to said first electrode above the surface of said base layer of the first conductivity type;

a base layer of the second conductivity type formed in substantially the same shape as said second electrode and connected to said second electrode on said base layer of the first conductivity type;

a source layer of the first conductivity type selectively formed on the surface of said base layer of the second conductivity type and connected to said second electrode; and a gate electrode formed above a portion of said base layer of the second conductivity type which lies between said source layer of the first conductivity type and said base layer of the first conductivity type with a gate insulating film disposed therebetween.

8. An insulated gate bipolar transistor according to claim 1, further comprising:

a substrate, and an insulating layer formed on said substrate and on which said base layer is formed.

9. An insulated gate bipolar transistor according to claim 4, further comprising:

a substrate, and an insulating layer formed on said substrate and on which said base layer is formed.

* * * * *